United States Patent
Kramer et al.

(10) Patent No.: US 7,182,475 B2
(45) Date of Patent: Feb. 27, 2007

(54) REFLECTOR

(75) Inventors: Tomas Kramer, Berlin (DE); Volkmar Gillich, Neuhausen am Rheinfall (CH); Roman Fuchs, Neuhausen (CH)

(73) Assignee: Alcan Technology & Management Ltd, Rhienfall (CH)

( * ) Notice: Subject to any disclaimer, the term of this patent is extended or adjusted under 35 U.S.C. 154(b) by 223 days.

(21) Appl. No.: 10/275,264

(22) PCT Filed: Apr. 27, 2001

(86) PCT No.: PCT/EP01/04752

§ 371 (c)(1),
(2), (4) Date: Jan. 9, 2003

(87) PCT Pub. No.: WO01/86327

PCT Pub. Date: Nov. 15, 2001

(65) Prior Publication Data

US 2004/0233530 A1 Nov. 25, 2004

(30) Foreign Application Priority Data

May 9, 2000 (EP) .......................... 008103970

(51) Int. Cl.
*G02B 5/124* (2006.01)

(52) U.S. Cl. ..................................... 359/514

(58) Field of Classification Search ............... 359/507, 359/512–514, 883–884, 584–589
See application file for complete search history.

(56) References Cited

U.S. PATENT DOCUMENTS

| 4,457,587 A | * | 7/1984 | Katayama et al. | .......... 359/883 |
| 4,737,246 A | * | 4/1988 | Powers et al. | .............. 205/116 |
| 5,215,832 A | | 6/1993 | Hughes et al. | |
| 5,290,424 A | | 3/1994 | Mozelewski et al. | |
| 5,478,414 A | | 12/1995 | Mozelewski et al. | |
| 5,637,404 A | | 6/1997 | Bombalski et al. | |
| 5,725,683 A | | 3/1998 | Serafin et al. | |
| 5,760,981 A | * | 6/1998 | Gillich | ........................ 359/883 |
| 5,764,415 A | * | 6/1998 | Nelson et al. | .............. 359/584 |
| 5,919,561 A | | 7/1999 | Fuchs et al. | |
| 5,955,147 A | | 9/1999 | Serafin | |
| 5,978,133 A | | 11/1999 | Gillich | |
| 5,985,046 A | | 11/1999 | Serafin et al. | |
| 6,067,189 A | | 5/2000 | Gillich | |
| 6,709,119 B2 | * | 3/2004 | Gillich et al. | ............... 359/883 |

FOREIGN PATENT DOCUMENTS

| DE | 42 25 623 C2 | 6/1994 |
| DE | 43 18 974 C2 | 4/1995 |
| DE | 197 15 940 A1 | 4/1998 |
| DE | 29815559 | 8/1999 |
| EP | 0568943 | 11/1993 |
| EP | 0816875 | 1/1998 |
| EP | 0824154 | 2/1998 |
| JP | 216101/84 | 5/1983 |
| JP | 05-323107 | 12/1993 |
| WO | PCT/US91/02811 | 4/1991 |

OTHER PUBLICATIONS

Patent Abstracts of Japan, No. 05323107, Published Jul. 12, 1993, App. Date May 25, 1992.
Derwent, Database WPI, Section Ch, Week 199402, AN 1994-013336.

* cited by examiner

*Primary Examiner*—Alessandro Amari
(74) *Attorney, Agent, or Firm*—Fisher, Christen & Sabol

(57) ABSTRACT

A weather and corrosion-resistant reflector with high overall reflection in the visible and infrared wavelength ranges. The reflector contains a reflector body with a reflection surface of an aluminum or aluminum alloy or a reflector body with a reflection coating of an aluminum or aluminum alloy. The reflector also contains an outer, final transparent protective layer of a sol-gel coating which is thicker than 1 μm. The transparent sol-gel coating is a polymer of cross-linked inorganic siloxanes with alcohol groups that are bonded to the silicon with a carbon bond. The sol-gel coating is produced in a sol-gel process and, after having been applied to the reflector body, is dried and hardened using heat. The protective layer has excellent resistance to weather, corrosion and abrasion.

69 Claims, 1 Drawing Sheet

REFLECTOR

This is a national stage application of International Application No. PCT/EP01/04752, filed on Apr. 27, 2001, that has priority benefit of European Patent Application No. 008103970.0, filed on May 9, 2000.

BACKGROUND OF THE INVENTION

1. Field of the Invention

The present invention concerns a weatherproof, corrosion-resistant reflector for electromagnetic radiation, in particular for infrared radiation, visible light and ultraviolet radiation, with a high total reflection, containing a reflector body of aluminum or an aluminum alloy with a reflective surface or containing a reflective body with a reflection layer of aluminum or an aluminum alloy forming a reflective surface, and a process for production of a reflector according to the invention.

2. Background Art

It is generally known to produce strips in bright materials e.g. pure aluminum, purest aluminum or AlMg alloys based on aluminum with a purity degree of 99.5% and higher, e.g. 99.8%, which, depending on application, generate diffused or directed light reflection. It is also known to increase the targeted reflection to brighten the surfaces of such strips chemically or electrolytically and then by anodic oxidization create a protective layer of e.g. 2–10 μm layer thickness.

In the open air, however, such reflectors have a restricted life. Moisture in cooperation with UV radiation or $CO_2$, $SO_2$ or pollutants in general lead to a reduction in reflection values i.e. reduction of the brightness or total reflection.

The anodization process and the relatively high layer thickness of the anodization layer of for example 2–10 μm also lead, in particular with less pure aluminum materials, to a reduction in the reflection degree on the surface i.e. a reduction both of the total reflection and the targeted reflection by absorption and diffuse light scatter in the oxide layer. To keep the said disadvantages within limits, therefore, high purity and expensive bright alloys based on purest aluminum must be used. High purity aluminum materials however often have unsatisfactory deformation behavior and low limits of elasticity, i.e. their strength is relatively low.

Reflectors are also known of glass surfaces with aluminum or silver mirroring on the rear. Such reflectors are however expensive to produce. They also have a high weight, are fragile and nondeformable.

BROAD DESCRIPTION OF THE INVENTION

The purpose of the present invention is to propose a reflector, the reflective side of which is resistant to weather and corrosion and mechanical influences and is also easy to clean. In addition, production in a continuous production process must be possible.

According to the invention the task is solved in that the reflective surface of aluminum or an aluminum alloy has a roughness Ra of less than 0.1 μm to DIN 4761 to DIN 4768 and the reflector has an external final transparent protective layer of a polymer of a thickness greater than 1 μm and the reflector according to the 2000h QUV test to ASTM G 53-96 has losses of total reflection and brilliance of less than 5%.

DETAILED DESCRIPTION OF THE INVENTION

The transparent protective layer is in particular a clear colorless transparent protective layer. The protective layer is preferably a sol-gel lacquer, in particular a sol-gel lacquer of a polysiloxane and advantageously a sol-gel lacquer of a polysiloxane produced from an alcoholic silane solution and a watery colloidal silicic acid solution. Polysiloxane is the term for polymers of cross-linked siloxanes.

The reflective surface can itself be formed by a metallic reflection layer applied to the reflector body or preferably by the reflector body surface itself.

The reflector body consists of or has at least one free surface, in particular a coating of a metal, in particular aluminum or an aluminum alloy e.g. aluminum with a purity of 98.3% and higher. The reflector body consists of or has at least one free surface, in particular a coating, advantageously of aluminum with a purity of 99.0% and higher, where applicable also with a purity of 99.5% and higher, preferably however with a purity of 99.7% and higher, and in particular 99.8% and higher. As well as aluminum of the said purities, preferably aluminum alloys can also be used. Preferred alloys are those of classes AA 1000, AA 3000 and AA 5000. Other suitable alloys contain for example 0.25 to 5 w. %, in particular 0.5 to 4 w. % magnesium or contain 0.2 to 2 w. % manganese or contain 0.5 to 5 w. % magnesium and 0.2 to 2 w. % manganese, in particular 1 w. % magnesium and 0.5 w. % manganese, or contain 0.1 to 12 w. %, preferably 0.1 to 5 w. %, copper or contain 0.5 to 6 w. % zinc and 0.5 to 5 w. % magnesium or contain 0.5 to 6 w. % zinc, 0.5 to 5 w. % magnesium and 0.5 to 5 w. % copper or contain 0.5 to 2 w. % iron and 0.2 to 2 w. % manganese, in particular 1.5 w. % iron and 0.4 w. % manganese or AlMgSi alloys or AlFeSi alloys. Further examples are AlMgCu alloys such as Al99.85Mg0.8Cu or AlMg alloys such as AlMg1, or AlFeMn alloys such as AlFeMn1.5.

The reflector body is preferably a rolled product and in particular a rolled sheet or strip, a rolled film or plate of rollable aluminum or a rollable aluminum alloy. The reflector body as a rolled product can where applicable be deformed e.g. by bending, deep drawing, cold flow pressing or similar.

Also, as a reflector body all physical structures can be used which have at least one free surface of one of the said aluminums or one of the said aluminum alloys or consist completely thereof. Also, only part areas or limited surface areas of the reflector body may consist of the said aluminum materials or aluminum alloys. Furthermore, the said physical structures may be profiles or bars.

The reflector body may also consist of castings or forgings of aluminum or an aluminum alloy.

Depending on use, the entire reflector body may consist of aluminum or an aluminum alloy but also only part areas or surface areas may consist thereof. The material of aluminum or aluminum alloy, e.g. in the form of a sheet, film, plate or coating, can also form part or a part surface of a laminate e.g. a film laminate or laminate of any materials e.g. plastic and aluminum, Al-coated plastic or Al-coated iron or steel plate.

The reflector body surface, i.e. the aluminum surface of the reflector body, can for example be produced by chemical and/or mechanical changes e.g. rolling, forging, cold flow pressing, pressing or casting. The reflective surface of the reflector body can in addition be subjected to subsequent treatment by grinding, polishing, blasting with hard substances etc. Preferred reflector bodies are those with rolled surfaces produced with smooth or structured rollers.

Preferred reflector bodies are sheets and strips, in particular rolled sheets and strips, of aluminum or an aluminum alloy of the said composition and aluminumcoated iron or steel sheet with a thickness for example of 0.1 to 10 mm, preferably 1 to 4 mm, in particular 0.2 to 1.5 mm, and particularly preferably 0.3 to 1 mm, where the aluminum coating is also an aluminum or an aluminum alloy of the said composition. One example is an aluminum sheet Al 99.5 (purity 99.5%) of thickness 0.5 mm.

The surface of the reflector body or the reflective surface can be pretreated and for example have a pretreatment layer. The pretreatment layer can for example be a layer produced by chromatizing, phosphatizing or anodic oxidation. Preferably, the pretreatment layer consists of anodic oxidised aluminum and is in particular produced from the aluminum lying on the surface of the reflector body.

The pretreatment layer can have a thickness of for example at least 10 nm, preferably at least 20 nm, in particular at least 50 nm and advantageously at least 100 nm. The maximum thickness of the pretreatment layer is for example 5000 nm, preferably 1500 nm and in particular 300 nm.

The pretreatment layer is preferably an anodically generated oxide layer which was constructed in a non-redissolving and preferably a redissolving electrolyte. The pretreatment layer is preferably a porous, anodically produced oxide layer.

Anodization preferably takes place in an acid electrolyte from the range of phosphoric acid, citric acid, tartaric acid, chromic acid electrolytes and in particular from the range of sulfuric acid electrolytes. Anodization takes place in the alternating and preferably direct current process. Unit anodizing and strip anodizing is possible.

The anodically generated oxide layer can also be subjected to a sealing or densification treatment. The said oxide layer is preferably not densified.

The pretreatment layer can also contain a yellows chromatized layer, a green chromatized layer, a phosphate layer or a chrome-free pretreatment layer grown in an electrolyte containing at least one of the elements Ti, Zr, F, Mo or Mn.

Furthermore, the aluminum surface for pretreatment can be brightened in a chemical or electrochemical process or subjected to an alkali pickling process. Such brightening or pickling processes are performed before anodizing.

Before application of a pretreatment layer or performance of a first pretreatment step, the reflector surface is suitably degreased and cleaned. The pretreatment may also comprise only degreasing and cleaning the reflector surface. The reflector surface can be cleaned in a known manner e.g. chemically and/or electrochemically by acid or alkali. Its purpose is to remove foreign substances and where applicable the naturally occurring oxide layer on the aluminum surface. Suitable cleaning agents are e.g. acidic watery degreasants, alkali degreasants based on polyphosphate and borate. Cleaning with moderate to severe material reduction is performed by pickling or etching using strong alkali or acidic pickling solutions e.g. sodium lye or a mixture of nitric acid and hydrofluoric acid. The oxide layer present with its contaminants is removed. When highly aggressive alkali pickling is used, where applicable acidic secondary treatment may be required.

Depending on the surface condition a mechanical surface removal by abrasive means may be required. Such surface treatment can for example take place by grinding, blasting, brushing or polishing and where applicable be supplemented by chemical secondary treatment.

In the preferred embodiment in a strip process a pretreatment layer is applied to an aluminum strip. For this an aluminum strip (Al 99.85, Ra 0.04 μm) with 500 mm width and 0.3 mm thickness is anodized continuously at around 40 m/min. The following stages are passed (through baths):

a) Degreasing at pH 9–9.5 at approx 50° C. and bonder V6150/01, b) Rinsing with tap water (room temperature), c) Anodizing in 20% $H_2SO_4$ at approx 25° C. and 20V voltage, d) Rinsing in tap water at around 50° C. and e) Rinsing in deionized water at approx 85° C.

The protective layer or further layers can be applied to the pretreatment layer. The strip is advantageously only cut into strips of the desired size and shape after completion of the coating i.e. after coating with the protective layer.

The reflective surface has a roughness Ra of suitably less than 0.1 μm, preferably less than 0.05 μm and in particular less than 0.02 μm. The surface roughness Ra is defined in at least one of DIN specifications 4761 to 4768.

The surface of the reflector body can be smooth or structured and for example have a light-conductive structure in the form e.g. of a rib pattern with toothed cross-section. The structuring can for example be produced by way of a roller with corresponding embossed pattern. The surface of the reflector body with relation to structuring or roughness can be composed such that the reflection of the radiation is targeted, scattered or a combination thereof.

The said roughness Ra of structured surfaces relates to the individual part areas of the surface structure i.e. the structuring itself logically is not included in the determination of roughness.

In a further embodiment a reflection layer forming the reflective surface and made of a metal, e.g. a layer of aluminum, silver, copper, gold, chromium, nickel or an alloy for example containing mostly at least one of the said metals, can be applied to the reflective body or its pretreatment layer. The thickness of the reflection layer can for example be 10 to 200 nm (nanometer). Furthermore, on the reflector body or its pretreatment layer, to smooth out the surface roughness, can be applied a functional layer in the form of an organic or inorganic sol-gel layer. Usually, the reflection layer here lies directly or by way of an adhesion layer on the functional layer. The composition of the functional layer is described in detail in EP 918 236 A1.

The reflection layer can also be part of a reflection layer system where the reflection layer systems contains one or more transparent layers applied to reflection layer. For example 1, 2, 3, 4, 5, 6, 7, 8, 9 or 10 transparent layers counted without the protective layer—advantageously fulfil with regard to optical thickness for each layer, formula 2/2, where in particular each of these transparent layers is a double layer of at least 2 layers of thickness 2/4. The optical thickness of each transparent layer with formula 2/2 can vary by ±40 nm. A transparent layer is preferred, or further preferably two, three or more transparent layers which can consist of the same or different materials, where each of the transparent layers has an optical thickness of 2/2±40 nm and in particular is a double layer of thickness 22/4. On the said transparent layer or layers as a top layer or as the layer lying on the surface is arranged the protective layer which in turn is also transparent. 2 corresponds to the intensity maximum of the wavelength of the reflective electromagnetic radiation.

The materials of the transparent layers of the reflection layer system consist of or contain e.g. oxides, nitrides, fluorides, sulfides etc. of alkali metals e.g. Li, Na, K, earth alkali metals e.g. Mg, Ca, Sr, Ba, semi-metals e.g. Si, transitional metals e.g. Sc, Ti, V, Cr, Mn, Fe, Co, Ni, Y, Zr, Nb, Mo, Te, Ru, Rh, Pd, Hf, Ta, W, Re, Os, Ir, Pt, lanthanoids e.g. La, Ce, Pr, Nd, Pm, Dy, Yb, Lu etc. We cite here namely $SiO_x$ where x has a significance from 1.1 to 2.0 and preferably 1.8, $Al_2O_3$, $MgF_2$, $TiO_2$, $B_2O_3$, Be-oxide, ZnO, $SnO_2$, indium tin oxide (ITO), CdS, CdTe and hafnium and zirconium oxide. Advantageously, at least one of the transparent layers with the exception of the protective layer contains materials other than that of the protective layer itself.

All or individual layers of the reflection layer system and the reflection layer can for example be applied to the reflector body or the pretreatment layer thereon by means of gas or vapor deposition in vacuum (physical vapor deposition, PVD), thermal vaporizabon, electron beam vaporization with or without ion support, sputtering in particular magnetron sputtering, plasma polymerization or chemical vapor deposition (CVD) with or without plasma support. Other application methods are paint or dip-drawing processes of solutions produced in the sol-gel process with subsequent drying, flame pyrolytic processes or flame coating by means of $SiO_2$. Two or more processes can also be combined. For example, PVD layers can be supplemented with a flame coating with $SiO_2$. The said reflection layer systems are for example described in detail in EP 918 236 A1.

The protective layer is suitably a sol-gel lacquer produced according to the sol-gel process and applied to the reflector body surface, the pretreatment layer or where applicable the reflection layer or the reflection layer system.

The sol-gel lacquer is preferably a polysiloxane produced from an alcoholic silane solution in particular alkoxysilane solution, and a colloidal silicic acid solution. The polysiloxane is produced in particular by a condensation reaction between hydrolyzed and cross-linked silanes in particular alkoxysilane and colloidal silicic acid.

The condensation reaction between hydrolyzed silanes, in particular alkoxysilane, and hydrolyzed silanes, in particular alkoxysilane, and colloidal silicic acid leads to the formation of an inorganic network of polysiloxanes. At the same time organic groups in particular alkyl groups or simple alkyl groups by way of carbon bonding are integrated in the inorganic network. The organic groups or alkyl groups, however, do not participate directly in the polymerization or cross-linking of the siloxanes i.e. they do not serve to form an organic polymer system but are merely for functionalization. The function is that the organic groups, in particular the alkyl groups, are attached to the outsides of the polysiloxane during the sol-gel process and as a result form an externally water-repellent layer which gives the sol-gel lacquer a pronounced hydrophobic property.

The sol-gel process described leads as stated by targeted hydrolysis and condensation of alkoxides of the silicon and silicic acid to a sol-gel lacquer of an inorganic network with integral alkyl groups. The resulting polysiloxanes can therefore be classified rather as inorganic polymers.

In the production of a preferred embodiment of a sol-gel lacquer as a protective coating suitably two basic solutions A and B are used.

Solution A is an alcoholic solution of one or more different alkoxysilanes where the alkoxysilanes are present in a water-free medium in non-hydrolyzed form. A suitable solvent is an alcohol e.g. methyl, ethyl, propyl or butyl alcohol and preferably isopropyl alcohol.

The alkoxysilanes are described by the general formula $X_{nSi}(OR)_{4-n}$ in which "R" is a simple alkyl, preferably of the group comprising methyl, ethyl, propyl and butyl. "X" is suitably also an alkyl preferably of the group comprising methyl, ethyl, propyl and butyl. Suitable alkoxysilanes are for example tetramethoxysilane (TMOS) and preferably tetramethoxysilane (TEOS) and methyltrimethoxysilane (MTMOS) and further alkoxysilanes.

In a particularly preferred embodiment solution A is prepared from tetramethoxysilane (TEOS) and/or methyltrimethoxysilane (MTMOS) with a methyl, ethyl or propyl alcohol and in particular with an isopropyl alcohol as solvent. Solution A can for example contain 25 to 35 w. % (weight %), in particular 30 w. %, TEOS and 15–25 w. %, in particular 20 w. %, MTMOS, both dissolved in 40–60, w. % in particular 50 w. %, isopropyl alcohol.

Solution B contains colloidal silicic acid dissolved in water. In a suitable embodiment solution B is adjusted by means of acid, preferably by means of nitric acid ($HNO_3$), to a pH value between 2.0 and 4, preferably between 2.5–3.0, and in particular 2.7.

The silicic acid used is suitably a silicic acid stabilized in the acid environment where the pH of the silicic acid is advantageously 2–4. The silicic acid is advantageously as low in alkali as possible. The alkali content (e.g. $Na_2O$) of the silicic acid is preferably less than 0.04 w. %.

Solution B contains for example 70–80 w. %, in particular 75 w. %, water as solvent and 20–30 w. %, in particular 25 w. %. colloidal silicic acid. Solution B is preferably set by means of nitric acid ($HNO_3$) to a pH value between 2.0–3.5, preferably between 2.5–3.0, and in particular 2.7. A preferred silicic acid solution is for example sold by the company Nissan Chemical Industries Ltd. with the product name "SNOWTEX®O".

The merging and mixing of the two basic solutions A and B in the presence of the nitric acid leads to a hydrolysis reaction between the water contained in solution B and the alkoxysilanes contained in solution A.

Hydrolysis reaction: $Si(OR)_n + nH_2O > Si(OH)n + nR(OH)$

At the same time a condensation reaction occurs in which, under water splitting from two Si—OH groups, a siloxane bonding (Si—O—Si) is created. Under continuous polymerization a network of polysiloxanes results, to which are linked alkyl groups. The new mixed solution is present in a gel state.

The two solutions A and B are mixed, preferably in a weight ratio of 7:3 parts.

The sol-gel lacquer is suitably applied or deposited in gel form on the reflector body or on the corresponding surface and then dried or hardened. The drying process consists of expelling the remaining water and alcohols in the sol-gel lacquer which causes the sol-gel lacquer to harden and a weatherproof and corrosion-resistant protective layer results on the reflector surface or reflection coating.

Coating is performed suitably in a continuous process by for example brushing, rolling, centrifuging, spraying, dipping or dip-drawing processes. Particularly preferred continuous coating processes are the band-pass process or band painting process also known as the coil coating process.

The layer thickness of the hardened sol-gel lacquer is for example at least 1 μm, preferably at least 2 μm and for example maximum 40 μm, further preferably maximum 20 μm, in particular maximum 10 μm and advantageously maximum 6 μm.

The reflector coated with the sol-gel lacquer is suitably dried or hardened by radiation e.g. UV radiation, electron radiation, laser radiation or by means of heat radiation e.g.

IR radiation, or by means of convection heating or a combination of the said drying or hardening processes.

The increased temperature measured on the reflector body to dry or harden the sol-gel lacquer is suitably greater than 60° C., preferably greater than 150° C. and in particular greater than 200° C. The increased temperature is further suitably less than 400° C., preferably less than 350° C. and in particular less than 300° C. The increased temperature is preferably between 250° C. and 300° C. The temperature given is a "peak metal temperature" (PMT).

The increased temperature can act for example on the body for 5 seconds to 2 minutes. The sol-gel lacquer is dried or hardened during a time of preferably less than 90 seconds, in particular less than 60 seconds and preferably more than 10 seconds, in particular more than 30 seconds. When IR radiation is used the drying times are in the lower range of the duration times given.

Convection heating can suitably be applied by the application of heated gases e.g. air, nitrogen, noble gases or mixtures thereof. The sol-gel lacquer is preferably dried in a passage oven.

The reflectors, for example in the form of films, strips or sheets, can be deformed even after application and drying of the protective layer. The reflectors can for example be processed into parabolic troughs. Deformation leads to scarcely any crack formation in the protective layer.

The reflectors according to the invention have a good protective effect against weather influences, corrosion, mechanical degradation or abrasion or have a high scratch resistance. Chalking practically does not occur. As in production of the siloxanes colloidal silicic acid is used, greater layer thicknesses in the micrometer range can be produced at which during the drying and hardening process no crack formation occurs e.g. due to volume contraction.

Further, the reflectors according to the invention allow the use of aluminum alloys without these needing to be plated or coated with pure or purest aluminum in order to achieve high brilliance and total reflection values. In contrast to reflectors of pure or purest aluminum, those according to the invention have considerably higher strength which is essential for a wide range of applications.

The reflector has a total reflection to DIN 5036 part 3, in particular a total reflection in the visible and infrared wavelength range, of more than 75%, preferably more than 80%, and in particular more than 83%.

If the reflector contains an additional reflection-increasing layer system, the said total reflection is more than 75%, preferably more than 85%, and in particular more than 90%.

The reflector furthermore has brilliance values in the visible wavelength range to DIN 67530 of over 75%, in particular over 80%.

The said total reflection and brilliance of the reflector according to the invention, for example after 3000h QUV test and in particular after 2000h QUV test, diminishes by less than 5%, and in particular by less than 2%.

The QUV test is an artificial weathering test to assess the weather resistance of components and their surfaces in the open air. The QUV test was introduced in 1969 by the company "Q Panel" and today is an internationally standardized test method. The QUV test used in the present experiments was performed in accordance with the specifications of "Standard practice for operating light and water exposure apparatus (fluorescent UV condensation type) for exposure of non-metallic metals" by the American Society for Testing and Materials or ASTM G 53-96.

Furthermore, in the 1000h "filiform corrosion test" to DIN EN ISO 3665, the reflector according to the invention showed no corrosion phenomena. In addition, the reduction in total reflection and brilliance in the 1000h "acetic acid saline spray test" to DIN 50021 ESS was less than 5%, in particular less than 2%.

Furthermore, the reflectors according to the invention, thanks to the sol-gel protective layer of polysiloxanes, have a high surface hardness. The sol-gel protective layer suitably has a hardness measured in the method "pencil process to Wolf Wilbum" according to DIN 55350 part 18, of greater than "f", preferably greater then "h", In particular greater than "2h". and advantageously greater than "3h", where greater means harder.

The sol-gel layer is also characterized by excellent adhesion to the reflector body or the layers lying thereon.

The reflector according to the invention can be produced in that the reflective surface of aluminum or an aluminum alloy has a roughness Ra of less than 0.1 μm to DIN 4761 to 4768 and the reflector contains an external final transparent protective layer of a polymer of a thickness greater than 1 μm and the protective layer is applied to the reflective surface, the pretreatment layer or reflection layer system in a continuous coil coating process and the protective layer of the reflector is dried and hardened in a continuous passage oven.

The strip coating speed in a strip passage process is suitably around 30 m/min.

The reflector body is preferably dried in a continuous passage oven under the effect of heat radiation and/or convection heat, preferably by application of heated gases.

Coating takes place suitably at room temperature e.g. 10–30° C., in particular 15 to 25° C.

The present invention also includes the use of the reflectors according to the invention as reflectors for solar or artificial light and infrared radiation and as light conduction elements for solar or artificial light.

The reflectors according to the invention are for example suitable as reflectors or light conduction elements in light and luminaire technology, as reflectors in video station lighting, primary lighting, secondary lighting, matrix lighting, illuminated ceilings or light deflection panels. Furthermore, the reflectors according to the invention can be used in solar technology as solar reflectors e.g. in thermal solar technology, as solar boosters in the field of photovoltaics, in solar power plants, as light-concentrating solar collectors, in solar cookers or solar ovens.

Furthermore, the reflectors according to the invention can be used as lightweight, unbreakable and where applicable heatable mirrors for vehicles or as headlamp reflectors. The said reflectors can also be used as facade elements with reflective properties or with brilliant properties. The bright or matt aluminum surfaces for example are sealed corrosion-resistant thanks to the protective layer according to the invention.

The IR radiation, visible light and UV radiation cover the wavelength range from $10^{-8}$ m to $10^{-3}$ m.

On the basis of an example the preparation and production of a particularly preferred embodiment of a sol-gel lacquer is described below. For this a solution A and a solution B are prepared:

Solution A contains:

50 w. % isopropyl alcohol 30 w. % tetramethoxysilane (TEOS)

20 w. % methyltrimethoxysilane (MTMOS)

Solution B contains:

75 w. % water 25 w. % colloidal silicic acid.

The pH value of solution B is set by addition of an acid, in particular nitric acid (HNO$_3$), to around 2.7.

Figure 1:
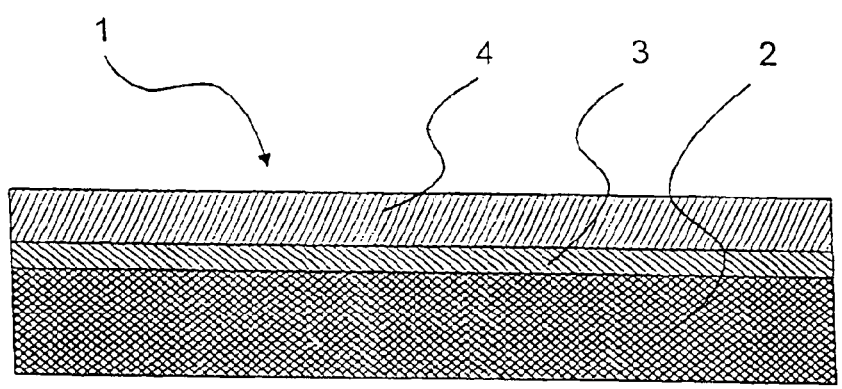
FIG. 1 is a cross-sectioned view through a reflector according to the invention.

The sol-gel lacquer is produced and the reflector body coated in the preferred embodiment as follows:

To a basic solution A as described above, in a proportion of 70 w. % of the mixed solution, is added under agitation a solution B in a proportion of 30 w. % of the mixed solution. Solutions A and B are transferred to a mixed solution under continuous agitation whereby reaction-induced heat is released.

The mixed solution is agitated for a particular time for example for 1 hour to 10 hours, preferably 4 to 8 hours, in particular for around 6 hours.

The mixture is then filtered. The filter serves to retain larger particles e.g. particles of colloidal silicic acid. The pore diameter or mesh width of the filter depends on the desired layer thickness as particles of greater diameter than the target layer thickness have a harmful effect on the surface quality of the protective layer. Filtration can for example take place by means of polypropylene filters with a porosity of 1 μm.

The mixed solution is suitably held at a pH value of 2–4, preferably 2 to 3.5, in particular 2.5 to 3 and particularly preferably 2.7. The pH value is adjusted by means of acid, preferably by means of nitric acid.

After conclusion of the agitation process the sol-gel lacquer can be applied by means of one of the said processes to the reflector body or the layers lying thereon and then dried or hardened as described above.

In an advantageous embodiment of the production process the sol-gel lacquer after its production and before application to the reflector body is allowed to rest for a few minutes to several hours, preferably between 1 and 24 hours, in particular between 12 and 22 hours and particularly preferably for around 17 hours.

Element analysis of the hardened sol-gel lacquer by means of XPS (X-ray photoelectron spectroscopy) shows for example the elements oxygen, silicon and around 5–20% (atomic percent) carbon.

The structure of the reflector according to the invention is for example shown in FIG. 1 which shows a cross-sectional view through a reflector according to the invention.

The reflector (1) consists of a reflector body (2) which is a rolled product of aluminum with a purity degree of greater than 99.8%. The surface of the reflector body (2) is degreased and given a pretreatment layer (3). The pretreatment layer (3) is an anodically produced oxide layer with a thickness of 300–500 nm. On the pretreatment layer is applied a sol-gel lacquer layer (4) of 3 μm thickness of polysiloxanes.

What is claimed is:

1. Weatherproof and corrosion-resistant reflector (1) for electromagnetic radiation, in particular for infrared radiation, visible light and ultraviolet radiation, with a high total reflection, containing a reflector body (2) of aluminum or an aluminum alloy with a reflective surface or containing a reflector body with a reflection layer of aluminum or an aluminum alloy forming a reflective surface, characterized in that the reflective surface of aluminum or an aluminum alloy has a roughness Ra of less than 0.1 μm to DIN 4761 to 4768 and the reflector (1) has an external final transparent protective layer (4) of a polymer of a thickness greater than 1 μm and the reflector according to the 2000 h QUV test to ASTM G 53-96 has losses of total reflection and brilliance of less than 5%.

2. The reflector according to claim 1, wherein the protective layer (4) is a sol-gel lacquer.

3. The reflector according to claim 2, wherein the transparent protective layer is a sol-gel lacquer of cross-linked inorganic polysiloxanes with organic groups bonded with the silicon by way of carbon bonds.

4. The reflector according to claim 3, wherein the organic groups of the cross-linked inorganic polysiloxanes are alkyl groups.

5. The reflector according to claim 3, wherein the reflector has a total reflection to DIN 5036 of greater than 75%.

6. The reflector according to claim 5, wherein the total reflection is the total reflection in the visible and infrared wavelength range, and the total reflection is greater than 80%.

7. The reflector according to claim 6, wherein the total reflection is greater than 83%.

8. The reflector according to claim 5, wherein in the 1000 h "filiform corrosion test" to DIN EN ISO 3665 the reflector shows no corrosion phenomena and in the 1000 h "acetic acid saline spray test" to DIN 50021 ESS has a reduction in total reflection and brilliance of less than 5%.

9. The reflector according to claim 8, wherein the reduction in total reflection and brilliance is less than 2%.

10. The reflector according to claim 8, wherein the protective layer (4) has a hardness measured using the "Pencil process to Wolf Wilburn" according to DIN 55350 part 18, of greater "f".

11. The reflector according to claim 10, wherein the hardness is greater than "3h".

12. The reflector according to claim 10, wherein the protective layer in the hardened state has a thickness of at least 1 μm and a maximum of 40 μm.

13. The reflector according to claim 12, wherein the protective layer in the hardened state has a thickness of at least 2 μm and a maximum of 20 μm.

14. The reflector according to claim 13, wherein the protective layer in the hardened state has a maximum thickness of 10 μm.

15. The reflector according to claim 12, wherein the reflector has a reflector body of aluminum and/or a coating of aluminum and the aluminum of the reflector body and/or the coating has a purity of greater than 99.5%.

16. The reflector according to claim 15, wherein the aluminum has a purity of greater than 99.8%.

17. The reflector according to claim 15, wherein the reflective surface has a pretreatment layer (3), and the pretreatment layer (30 is an oxide layer produced anodically in a redissolution or non-redissolution electrolyte and the protective layer (4) is applied directly to the oxide layer.

18. The reflector according to claim 17, wherein the reflective surface is the reflector body surface and the oxide layer is a porous oxide layer produced anodically in a redissolution electrolyte.

19. The reflector according to claim 18, wherein the porous layer is a non-densified porous oxide layer.

20. The reflector according to claim 17, wherein the pretreatment layer has a thickness of at least 10 nm and a maximum of 500 nm.

21. The reflector according to claim 20, wherein the pretreatment layer has a thickness of at least 100 nm and a maximum of 500 nm.

22. The reflector according to claim 17, wherein on the reflective surface of the reflector is applied a pretreatment layer produced by chromatizing or phosphatizing and the protective layer (4) is applied directly to the pretreatment layer.

23. The reflector according to claim 22, wherein on the reflective surface of the reflector is applied a pretreatment layer and the pretreatment layer is a yellow chromatized layer, a green chromatized layer, a phosphate layer or a chromium-free pretreatment layer which is grown in an electrolyte containing at least one of the elements Ti, Zr, F, Mo or Mn.

24. The reflector according to claim 23, wherein the pretreatment layer has a thickness of at least 10 nm and a maximum of 5000 nm.

25. The reflector according to claim 24, wherein the pretreatment layer has a thickness of at least 100 nm and a maximum of 500 nm.

26. The reflector according to claim 24, wherein the reflector body is a rolled product.

27. The reflector according to claim 26, wherein the reflector body is a rolled sheet, strip or plate of a rollable aluminum or aluminum alloy and the roughness Ra of the reflected surface is less than 0.05 μm.

28. The reflector according to claim 26, wherein the reflector body has a thickness of 0.3 to 1 mm.

29. The reflector according to claim 26, wherein the reflector body is a rolled sheet or strip of aluminum or an aluminum alloy with a thickness of 0.1 to 4 nm.

30. The reflector according to claim 29, wherein the protective layer (4) is applied to the reflector body surface or its pretreatment layer.

31. The reflector according to claim 30, wherein the reflector is a reflector body of aluminum, an aluminum alloy, a ferrous metal or a plastic with a reflection layer of aluminum or an aluminum alloy, and the protective layer is applied to the reflection layer.

32. The reflector according to claim 31, wherein the reflector body contains a reflection layer system of a reflective layer and a reflection-increasing layer system with one or more transparent layers applied to the reflective layer, and the final protective layer is applied to the reflection layer system.

33. The reflector according to claim 32, wherein the reflector has a total reflection to DIN 5036 of greater than 75%.

34. The reflector according to claim 33, wherein the reflector has a total reflection in the visible and infrared wavelength range of greater than 90%.

35. Process for production of a weatherproof and corrosion-resistant reflector (1) for electromagnetic radiation, in particular infrared radiation, visible light and ultraviolet radiation, with a high total reflection, containing a reflector body (2) of aluminum or an aluminum alloy with a reflective surface or containing a reflector body with a reflection layer of aluminum or an aluminum alloy according to claim 1, characterized in that the reflective surface of aluminum or an aluminum alloy has a roughness Ra of less than 0.1 μm to DIN 4761 to 4768 and the reflector (1) contains an external final transparent protective layer (4) of a polymer of a thickness greater than 1 μm and the protective layer (4) is applied to the reflective surface, the pretreatment layer or reflection layer system in a continuous coil coating process and the protective layer (4) of the reflector (1) is dried and hardened in a continuous passage oven.

36. The process according to claim 35, wherein the reflector body is coated with the protective layer at room temperature and the protective layer of the reflector is dried in a continuous passage oven under the effect of heat radiation and/or convection heat.

37. The process according to claim 36, wherein the protective layer of the reflector is dried at a reflector temperature between 110 and 400° C. for a time of less than 90 seconds.

38. The process according to claim 37, wherein the protective layer of the reflector is dried at a reflector temperature between 250 and 300° C. for a time of less than 60 seconds.

39. The process according to claim 36, wherein the continuous passage oven is operated under application with heated gases.

40. The reflector according to claim 1, wherein the sol-gel lacquer is a sol-gel lacquer of a polysiloxane.

41. The reflector according to claim 40, wherein the sol-gel lacquer is a sol-gel lacquer of a polysiloxane produced from an alcoholic silane solution and a watery colloidal silicic acid solution.

42. The reflector according to claim 41, wherein the alcoholic silane solution is an alkoxysilane solution.

43. The reflector according to claim 1, wherein the transparent protective layer is a sol-gel lacquer of cross-linked inorganic polysiloxanes with organic groups bonded with the silicon by way of carbon bonds.

44. The reflector according to claim 43, wherein the organic groups of the cross-linked inorganic polysiloxanes are alkyl groups.

45. The reflector according to claim 1, wherein the reflector has a total reflection to DIN 5036 of greater than 75%.

46. The reflector according to claim 45, wherein the total reflection is the total reflection in the visible and infrared wavelength range, and the total reflection is greater than 80%.

47. The reflector according to claim 1, wherein in the 1000 h "filiform corrosion test" to DIN EN ISO 3665 the reflector shows no corrosion phenomena and in the 1000 h "acetic acid saline spray test" to DIN 50021 ESS has a reduction in total reflection and brilliance of less than 5%.

48. The reflector according to claim 47, wherein the reduction in total reflection and brilliance is less than 2%.

49. The reflector according to claim 1, wherein the protective layer (4) has a hardness measured using the "Pencil process to Wolf Wilburn" according to DIN 55350 part 18, of greater than "3h".

50. The reflector according to claim 49, wherein the hardness measured is greater than "3h".

51. The reflector according to claim 1, wherein the protective layer in the hardened state has a thickness of at least 1 μm, and a maximum of 40 μm.

52. The reflector according to claim 51, wherein the protective layer in the hardened state has a thickness of at least 2 μm and a maximum of 20 μm.

53. The reflector according to claim 52, wherein the protective layer in the hardened state has a maximum thickness of 10 μm.

54. The reflector according to claim 1, wherein the reflector has a reflector body of aluminum and/or a coating of aluminum and the aluminum of the reflector body and/or the coating has a purity of greater than 99.5%.

55. The reflector according to claim 54, wherein the aluminum has a purity of greater than 99.8%.

56. The reflector according to claim 1, wherein the reflective surface has a pretreatment layer (3), and the pretreatment layer (3) is an oxide layer produced anodically in a redissolution or non-redissolution electrolyte and the protective layer (4) is applied directly to the oxide layer.

57. The reflector according to claim 56, wherein the reflective surface is the reflector body surface and the oxide layer is a porous oxide layer produced anodically in a redissolution electrolyte.

58. The reflector according to claim 57, wherein the porous oxide layer is a non-densified porous oxide layer.

59. The reflector according to claim 1, wherein on the reflective surface of the reflector is applied a pretreatment layer produced by chromatizing or phosphatizing and the protective layer (4) is applied directly to the pretreatment layer.

60. The reflector according to claim 1, wherein on the reflective surface of the reflector is applied a pretreatment layer and the pretreatment layer is a yellow chromatized layer, a green chromatized layer, a phosphate layer or a chromium-free pretreatment layer that is grown in an electrolyte containing at least one of the elements Ti, Zr, F, Mo or Mn.

61. The reflector according to claim 1 wherein the reflector is a rolled product.

62. The reflector according to claim 61, wherein the reflector body is a rolled sheet, strip or plate of a rollable aluminum or aluminum alloy and the roughness Ra of the reflected surface is less than 0.05 μm.

63. The reflector according to claim 1, wherein the reflector body is a rolled sheet or strip of aluminum or aluminum alloy with a thickness of 0.1 to 4 mm.

64. The reflector according to claim 63, wherein the reflector body has a thickness of 0.3 to 1 mm.

65. The reflector according to claim 1, wherein the protective layer (4) is applied to the reflector body surface or its pretreatment layer.

66. The reflector according to claim 1, wherein the reflector is a reflector body of aluminum, an aluminum alloy, a ferrous metal or a plastic, with a reflection layer of aluminum or an aluminum alloy, and the protective layer is applied to the reflection layer.

67. The reflector according to claim 1, wherein that the reflector body contains a reflection layer system of a reflective layer and a reflection-increasing layer system with one or more transparent layers applied to the reflective layer, and the final protective layer is applied to the reflection layer system.

68. An apparatus of a reflector according to claim 1 in a solar or artificial light and infrared radiation device or as a light conduction element in solar or artificial light device.

69. An apparatus of a reflector according to claim 1 in light and luminaire technology as a reflector in a video station lighting, primary lighting, secondary lighting, matrix lighting, illuminated ceiling or as a light deflector panel in solar technology as a solar reflector in a solar power plant, solar cooker or solar oven.

* * * * *